US012804854B2

(12) United States Patent
Jeanrot et al.

(10) Patent No.: US 12,804,854 B2
(45) Date of Patent: Nov. 17, 2026

(54) THERMAL REGULATION DEVICE AND ASSOCIATED PIECE OF ELECTRONIC EQUIPMENT

(71) Applicant: SAGEMCOM BROADBAND SAS, Rueil Malmaison (FR)

(72) Inventors: Nathan Jeanrot, Rueil Malmaison (FR); Cécile Maurech, Rueil Malmaison (FR)

(73) Assignee: SAGEMCOM BROADBAND SAS, Bois-Colombes (FR)

( * ) Notice: Subject to any disclaimer, the term of this patent is extended or adjusted under 35 U.S.C. 154(b) by 110 days.

(21) Appl. No.: 18/679,734

(22) Filed: May 31, 2024

(65) Prior Publication Data

US 2024/0407138 A1 Dec. 5, 2024

(30) Foreign Application Priority Data

Jun. 2, 2023 (FR) ....................................... 2305558

(51) Int. Cl.

| | |
|---|---|
| ***H05K 7/20*** | (2006.01) |
| ***H05K 1/02*** | (2006.01) |
| ***H10W 40/22*** | (2026.01) |
| ***H10W 40/43*** | (2026.01) |

(52) U.S. Cl.

CPC ....... *H05K 7/20418* (2013.01); *H05K 1/0201* (2013.01); *H05K 7/20145* (2013.01); *H05K 7/20154* (2013.01); *H05K 7/20509* (2013.01); *H10W 40/226* (2026.01); *H10W 40/43* (2026.01); *H05K 7/20127* (2013.01)

(58) Field of Classification Search

CPC ........... H05K 7/20127; H05K 7/20145; H05K 7/20154; H05K 7/20418; H05K 7/20509; H10W 40/226; H10W 40/43

See application file for complete search history.

(56) References Cited

U.S. PATENT DOCUMENTS

| | | | | | |
|---|---|---|---|---|---|
| 5,381,859 | A * | 1/1995 | Minakami | H10W 40/73 | 174/16.3 |
| 5,535,816 | A * | 7/1996 | Ishida | F28F 3/02 | 257/722 |
| 5,653,285 | A | 8/1997 | Lee | | |
| 6,634,421 | B2 * | 10/2003 | Ognibene | H10W 40/47 | 257/E23.098 |
| 10,871,334 | B2 * | 12/2020 | Pal | F28F 3/12 | |
| 12,584,698 | B2 * | 3/2026 | Chen | F28F 3/04 | |
| 2002/0056544 | A1 | 5/2002 | Azar | | |
| 2007/0215336 | A1 | 9/2007 | Hsu | | |
| 2019/0335614 | A1 | 10/2019 | Nozaki et al. | | |

FOREIGN PATENT DOCUMENTS

| | | | |
|---|---|---|---|
| EP | 4472372 | A1 | 12/2024 |

* cited by examiner

*Primary Examiner* — Eric S Ruppert
*Assistant Examiner* — Hans R Weiland
(74) *Attorney, Agent, or Firm* — MUNCY, GEISSLER, OLDS & LOWE, P.C.

(57) ABSTRACT

Thermal regulation device comprising at least:

One plate (2),

At least two heat sinks (4) fitted on the plate, each heat sink comprising at least one opening through which an airflow is intended to circulate, the two heat sinks being fitted on the plate, such that their openings are offset against one another and/or such that at least one wall outlining at least one of the openings is located in the alignment of the other opening. Associated piece of electronic equipment.

18 Claims, 9 Drawing Sheets

[Fig. 1]
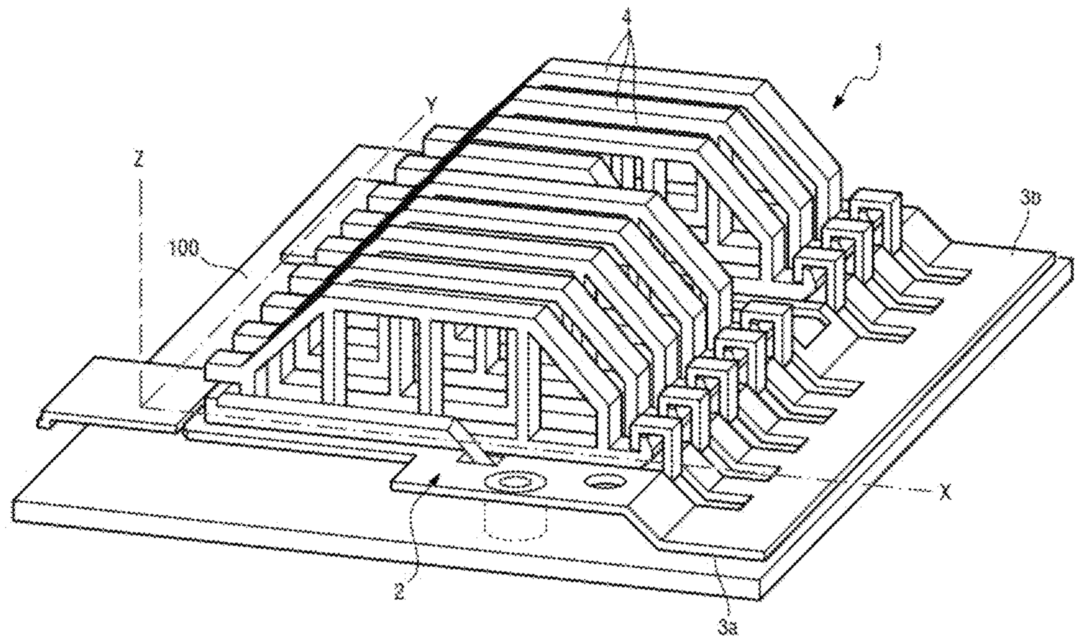

[Fig. 2]
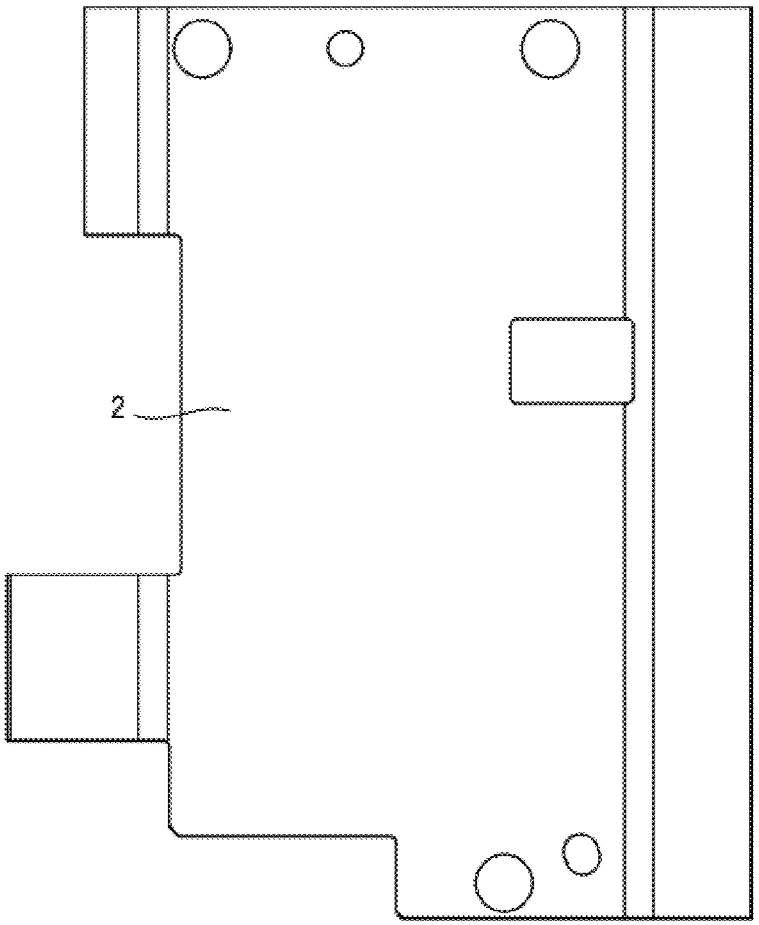
[Fig. 3]
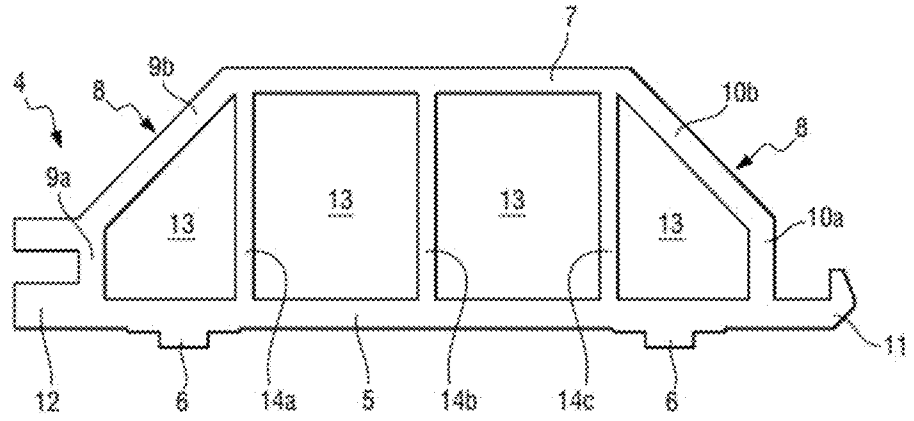

[Fig. 4]
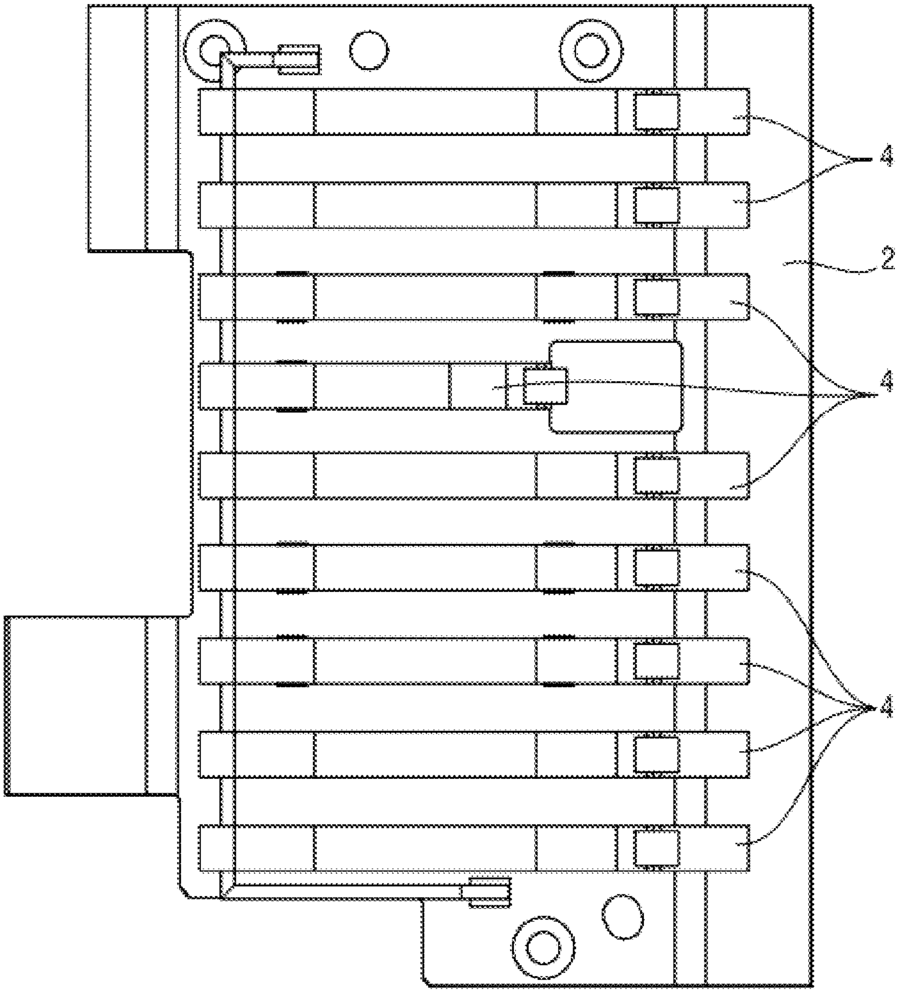

[Fig. 5]
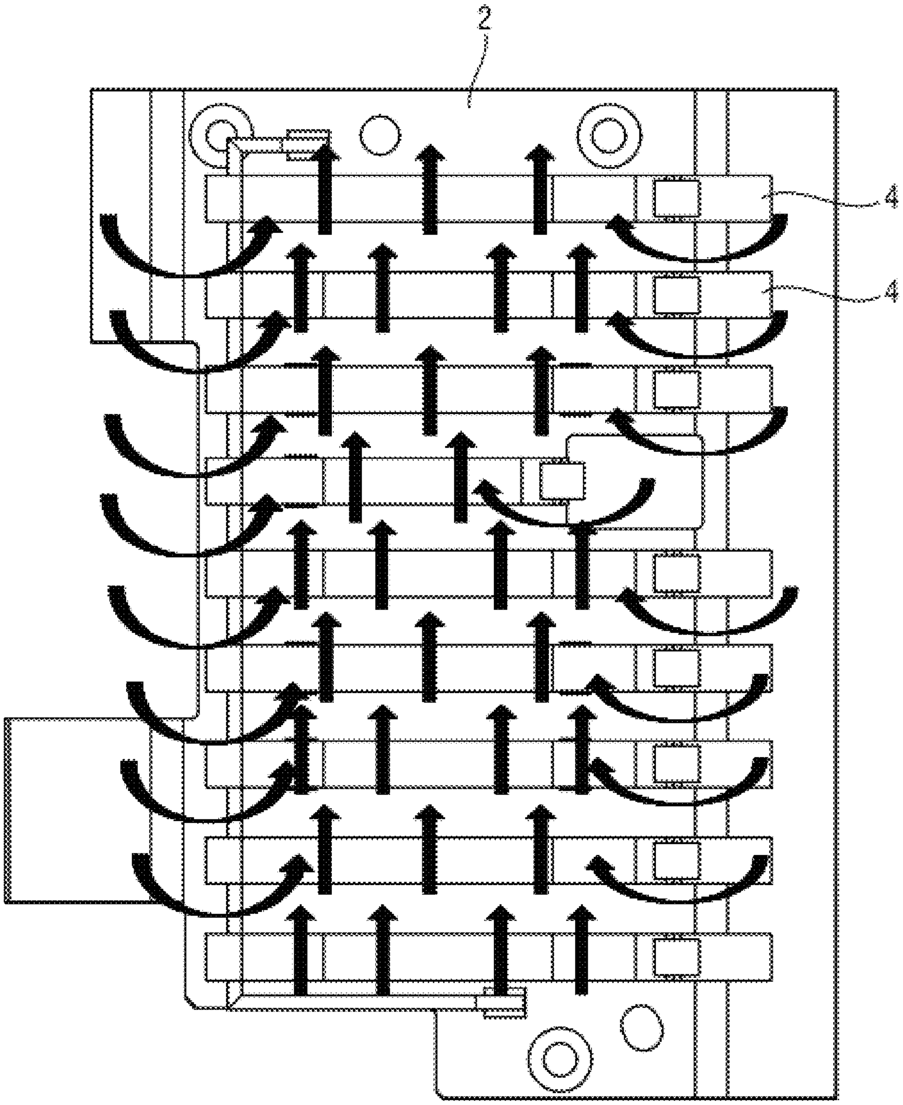

[Fig. 6]
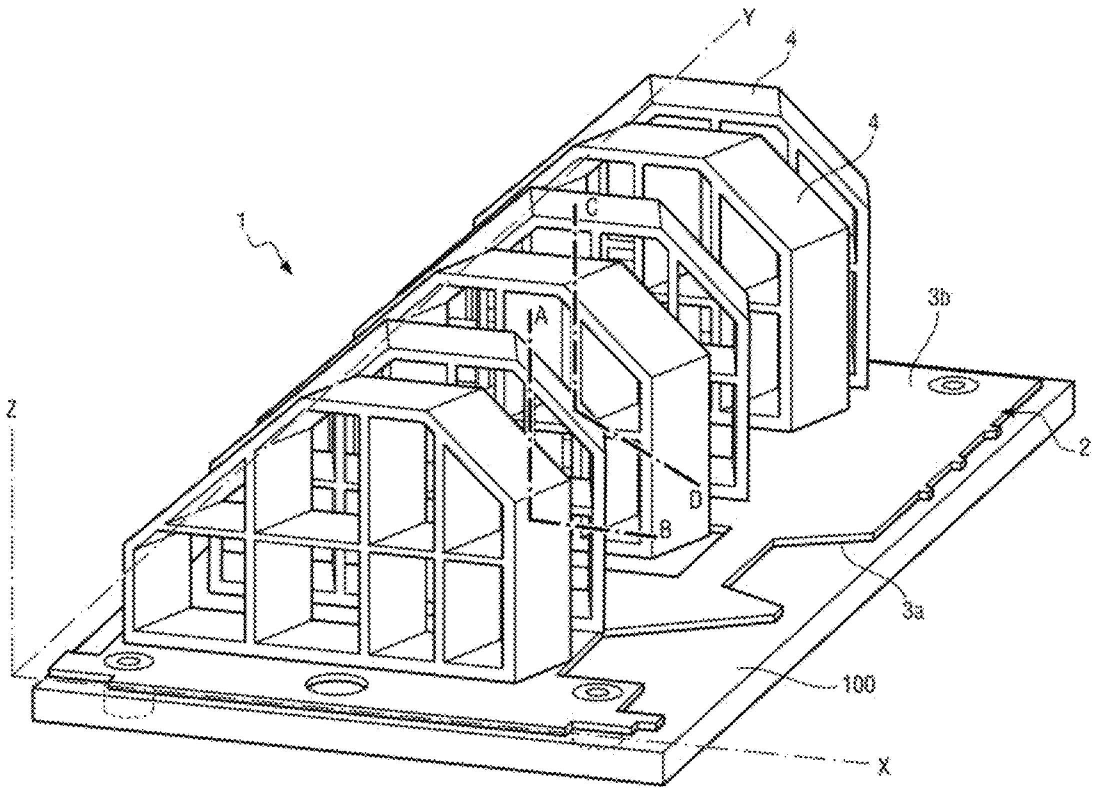

[Fig. 7]
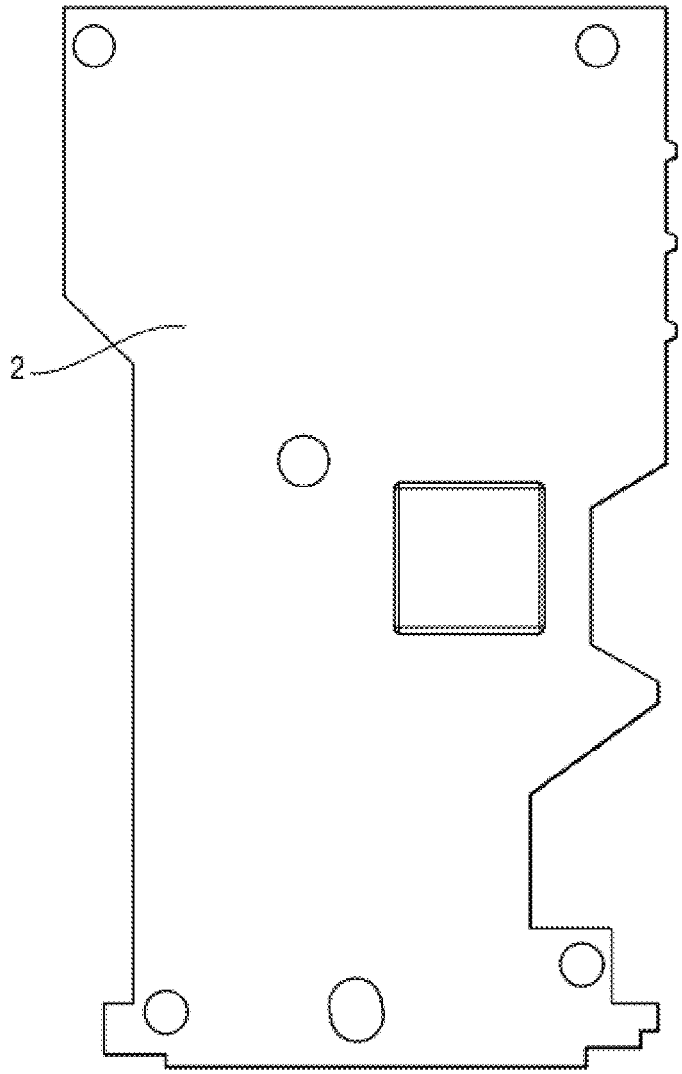

[Fig. 8]
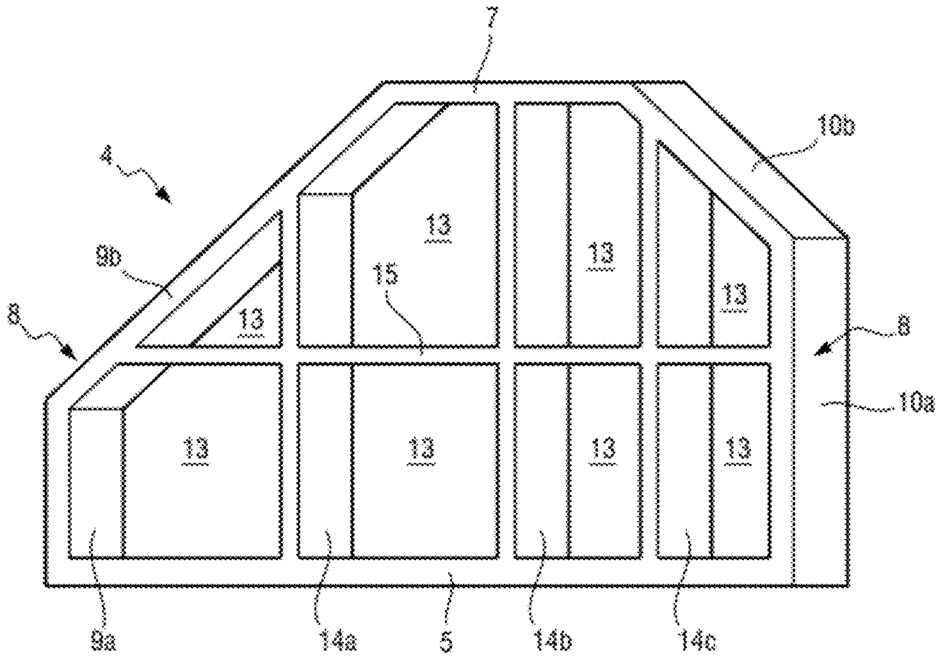

[Fig. 9]
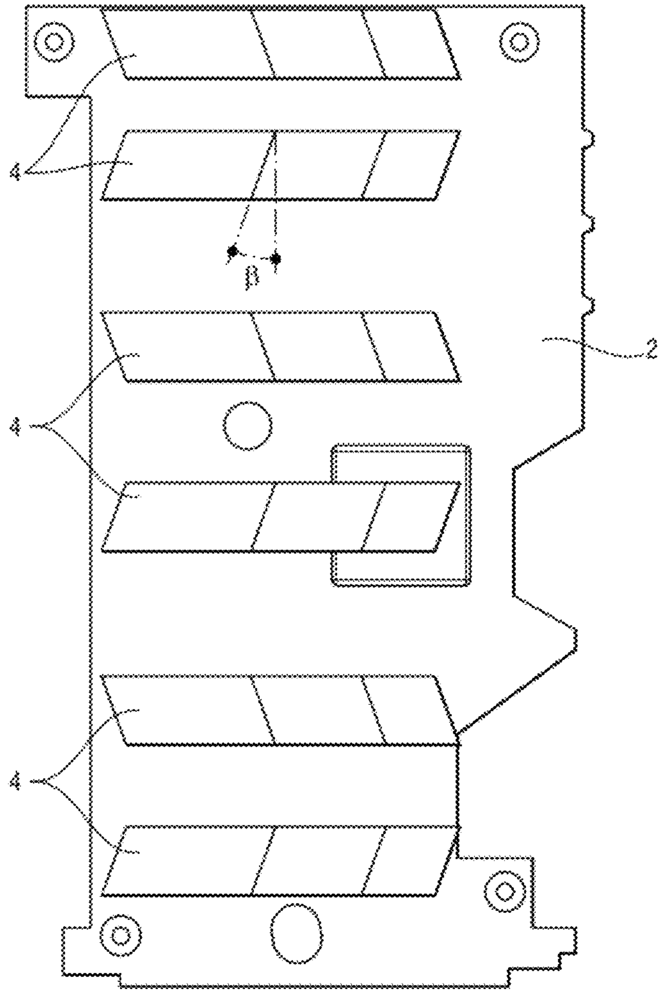

[Fig. 10]
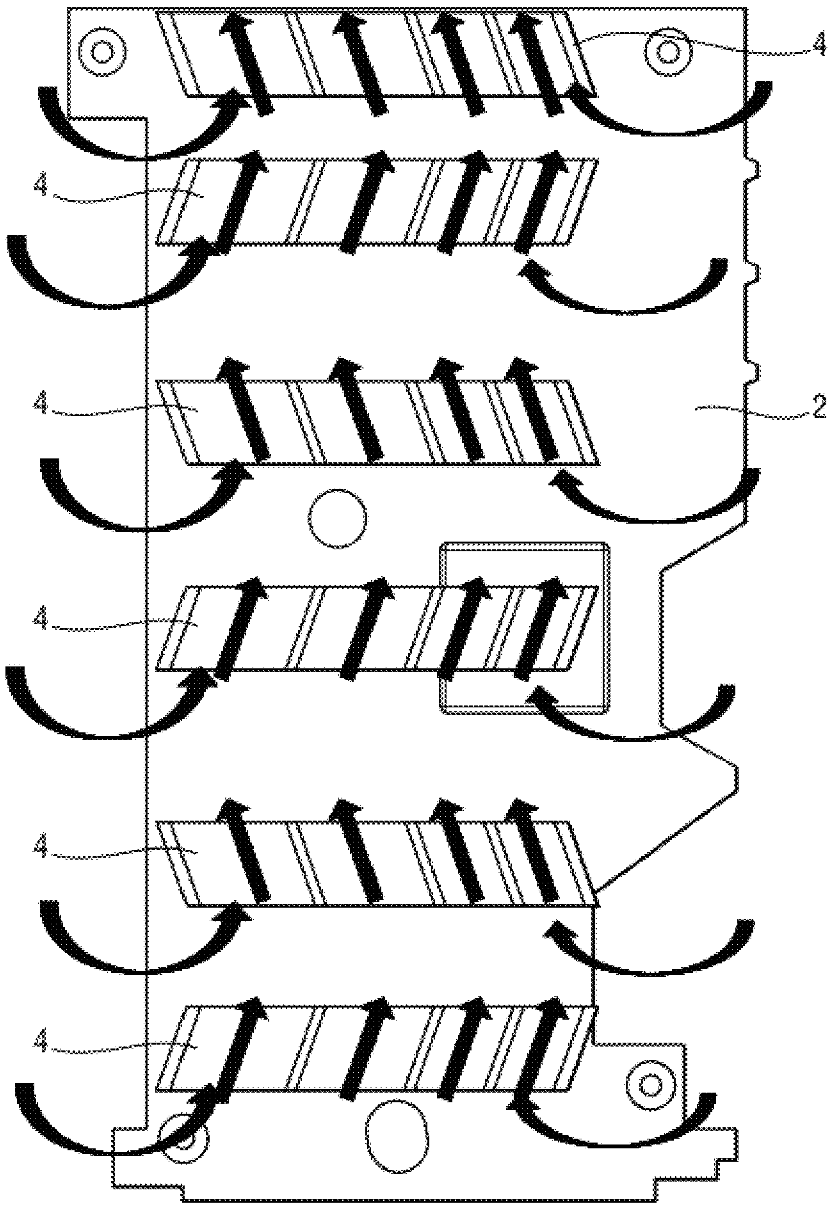

THERMAL REGULATION DEVICE AND ASSOCIATED PIECE OF ELECTRONIC EQUIPMENT

The invention relates to a thermal regulation device. The invention also relates to a piece of electronic equipment comprising such a thermal regulation device.

BACKGROUND OF THE INVENTION

In the field of electronics, it is known to associate thermal regulation devices to electronic equipment, in order to facilitate the discharge of heat released by said electronic equipment to avoid them being damaged.

Usually, a thermal regulation device is formed of one single part having a baseplate extended with fins at the upper part. The baseplate is, for example, intended to be affixed on an electronic board such as a printed circuit board, such that the baseplate extends parallel to the board. The thermal regulation device is usually made of aluminium to facilitate heat exchanges.

Thermal regulation devices made of aluminium are generally manufactured, either by extrusion or by injection, such that the fins are in one piece with the baseplate.

Manufacturing by extrusion makes it possible to produce parts having thinner thicknesses, which considerably reduces the volume and the weight of said parts. Furthermore, the aluminium used is more thermally efficient than that used for manufacturing by injection. Manufacturing by extrusion however only makes it possible to produce simple-shaped parts. If a particular part with technical shapes is needed, it is thus necessary after extrusion to perform returns on the part already produced, which increases the production cost of the part.

Manufacturing by injection however makes it possible to manufacture complex parts.

However, the parts produced thus have a consequent thickness and the aluminium used has worse thermal performance than with extrusion.

The parts produced are thus heavy and expensive.

In addition, if it is sought to compensate for the lack of thermal performance of said parts, its dimensions must thus be increased, which makes them heavier and increases their manufacturing costs.

AIM OF THE INVENTION

An aim of the invention is to propose a solution making it possible to prevent at least partially, at least one of the abovementioned disadvantages.

SUMMARY OF THE INVENTION

To this end, a thermal regulation device is provided, comprising at least:

One plate,

At least two heat sinks fitted on the plate, each heat sink comprising at least one opening, through which an airflow is intended to circulate, the two heat sinks being fitted on the plate, such that their openings are offset against one another and/or such that at least one wall defining at least one of the openings is located in the alignment of the other opening, wherein the heat sinks are fitted on the plate, so as to extend following one another along an axis, the device comprising between two and six groups of thermal heat sinks, the heat sinks being identical within one same group, but different between two groups, the heat sinks being arranged, so as to alternate on at least one zone of the device successively, along the axis, a heat sink of each of the groups.

In this way, the plate and the heat sinks are manufactured separately, then assembled secondly. This offers a greater freedom of placement of the heat sinks on the plate.

In particular, it is thus possible to offset the openings of the heat sinks (angular offset and/or transverse offset) and/or to have openings of different shapes. In this way, the airflow (natural or forced) which circulates in the invention encounters obstacles (the heat sinks) which disrupt the airflow by dividing it and/or modifying its orientation.

This favours heat exchanges between the heat sinks and the airflow. The thermal regulation device has proved to be particularly effective.

Furthermore, because the invention makes it possible to optimise the heat exchanges with the surrounding air, the thermal regulation device can be of relatively reduced dimensions.

It has proved to be lighter and relatively inexpensive to produce. In particular, the fact of being able to separately produce the plate and heat sinks, makes it possible for them to be easily produced in large series.

This makes it possible to reduce the production costs.

The invention also relates to a piece of electronic equipment equipped with such a thermal regulation device.

Optionally, at least one of the heat sinks has an orifice and at least one partition passing through said orifice, so as to divide it into two openings.

Optionally, the wall located in the alignment of the other opening is the partition.

Optionally, the partition has a thickness of between 1 and 3 millimetres.

Optionally, the partition extends in an inclined manner, relative to at least one upper wall, a lower wall or a side flank of the associated dissipator.

Optionally, each of the heat sinks comprises a partition extending in an inclined manner, relative to at least one upper wall, a lower wall or a side flank of the associated dissipator.

Optionally, the openings are angularly offset against one another and/or are offset transversally against one another.

Optionally, the heat sinks are arranged parallel to one another.

Optionally, the heat sinks are offset from one another in a longitudinal direction of the plate.

Optionally, the at least two heat sinks have a different geometry.

Optionally, the plate and/or at least one of the heat sinks is made of or is based on aluminium alloy.

Optionally, the plate and/or at least one of the heat sinks is an injected or extruded part.

Optionally, the plate and at least one of the heat sinks are made of the same material.

Optionally, at least one of the heat sinks is provided with at least one tab by way of which it rests against the plate.

The invention also relates to a piece of electronic equipment equipped with a thermal regulation device such as mentioned above. Optionally, the electronic equipment is an electronic board.

Other features and advantages of the invention will emerge upon reading the description below of particular and non-limiting embodiments of the invention.

BRIEF DESCRIPTION OF THE DRAWINGS

Reference will be made to the accompanying drawings, among which:

FIG. 1 is a perspective view of a thermal dissipation device according to a first embodiment of the invention associated with a printed circuit board;

FIG. 2 is a top view of a plate of the device illustrated in FIG. 1;

FIG. 3 is a side view of a heat sink of the device illustrated in FIG. 1;

FIG. 4 is a top view of the device illustrated in FIG. 1;

FIG. 5 is a view similar to that of FIG. 4, the airflows circulating through the device being symbolised by arrows;

FIG. 6 is a perspective view of a thermal dissipation device according to a second embodiment of the invention associated with a printed circuit board;

FIG. 7 is a top view of a plate of the device illustrated in FIG. 6;

FIG. 8 is a perspective view of a heat sink of the device illustrated in FIG. 6;

FIG. 9 is a top view of the device illustrated in FIG. 6;

FIG. 10 is a view similar to that of FIG. 9, the airflows circulating through the device being symbolised by arrows.

DETAILED DESCRIPTION OF THE INVENTION

In reference to FIGS. 1 to 5, a first embodiment will be described.

The thermal regulation device 1 is associated with a piece of electronic equipment 100, in order to thermally regulate said piece of electronic equipment 100. The piece of electronic equipment 100 is, for example, an electronic board such as a printed circuit board.

The device 1 comprises a plate 2 which is shaped in a small plate. The plate 2 thus has a thinner thickness than its other dimensions. The plate 2 thus has two main faces: a first main face 3*a* and a second main face 3*b*.

The device 1 is arranged, such that the first main face 3*a* extends facing one of the faces of the piece of electronic equipment 100. In the present case, the first main face 3*a* extends facing one of the main faces of the piece of electronic equipment 100. Preferably, the device 1 is arranged, such that the first main face 3*a* extends parallel to one of the main faces of the piece of electronic equipment 100.

The plate 2 is, in this case, fixed to the piece of electronic equipment 100. The plate 2 is thus affixed on the piece of electronic equipment 100 and is located in contact with at least one zone of the piece of electronic equipment 100.

The connection between the plate 2 and the piece of electronic equipment 100 is similar to that of a baseplate of a thermal regulation device of the prior art and will therefore not be detailed in this case.

The device 1 moreover comprises a plurality of heat sinks 4 (only a part of which is referenced in FIG. 1) fitted on the second main face 3*b* of the plate 2. The device 1 comprises, for example, between 2 and 12 heat sinks 4 and, for example, between 2 and 9 heat sinks 4.

The different heat sinks 4 are fitted on the plate 2, so as to extend, in this case, parallel to one another. For example, the heat sinks 4 are arranged, so as to extend parallel to the side edges of the plate 2 which themselves extend parallel to an axis X. The second main face 3*b* is thus defined by a plane containing the axis X and an axis Y orthogonal to the axis X.

The heat sinks 4 are moreover arranged on the plate 2, such that their width extends parallel to the axis Y and their length extends parallel to the axis X.

The heat sinks 4 are moreover fitted on the plate 2, so as to extend following one another along the axis Y. For example, the distance (along the axis Y) between two successive heat sinks 4 is greater than 4 millimetres and, for example, greater than 5 millimetres. For example, the distance (along the axis Y) between two successive heat sinks 4 is less than 50 millimetres and, for example, less than 40 millimetres. Optionally, the interval between two successive heat sinks 4 is the same over the entire length (along the axis Y) of the second main face 3*b*.

Each heat sink 4 has two main faces extending parallel to one another. In this case, each heat sink is shaped, such that its two main faces extend parallel to a plane containing the axis X and an axis Z which is orthogonal to the axis X and to the axis Y (the thickness of the plate 2 being defined along this axis Z).

One of the heat sinks 4 will now be described, the description below also applying to the other heat sinks 4 in the present case. The heat sink 4 is formed of several walls, each wall being shaped in a small plate. The heat sink 4 is preferably made of one single part. Preferably, the different walls forming the heat sink 4 have a thickness of between 1 and 3 millimetres. At least two walls of one same heat sink 4 can optionally have the same thickness.

The heat sink 4 has a lower wall 5 mounted facing the plate 2 and mounted optionally parallel to the second main face 3*b*. The lower wall 5 thus extends into a plane parallel to the axes X and Y. The lower wall 5 is shaped in a plate.

The lower wall 5 is optionally provided with at least one tab and, for example, at least two tabs 6 by way of which the heat sink 4 rests on the plate 2.

The contacts with the heat sink 4 and the plate 2 are thus of small dimensions.

The tabs 6 can moreover facilitate the positioning of the heat sink 4 on the plate 2.

The heat sink 4 optionally comprises at least one upper wall 7 arranged above the lower wall 5 and extending optionally parallel to the lower wall 5. The upper wall 7 thus extends into a plane parallel to the axes X and Y. The upper wall 7 is shaped in a plate.

The heat sink 4 moreover comprises side flanks 8 to connect the lower 5 and upper 7 walls to one another.

For example, the left side flank 8 comprises a first wall 9*a* and a second wall 9*b*, the first wall 9*a* extending from the lower wall 5 to the second wall 9*b* and the second wall 9*b* extending from the first wall 9*a* to the upper wall 7. Likewise, the right side flank 8 comprises a first wall 10*a* and a second wall 10*b*, the first wall 10*a* extending from the lower wall 5 to the second wall 10*b* and the second wall 10*b* extending from the first wall 10*a* to the upper wall 7. The first walls 9*a*, 10*a* and the second walls 9*b*, 10*b* are, in this case, shaped in sheets.

In the present case, the first walls 9*a*, 10*a* extending parallel to one another. Optionally, the first walls 9*a*, 10*a* extend orthogonally to the lower wall 5.

In the present case, the second walls 9*b*, 10*b* extend along one same inclination relative to the first associated wall, but in opposite directions, such that the two walls 9*b*, 10*b* move closer to one another, as the upper wall 7 is moved closer to. The upper wall 7 is therefore of a length (along the axis X) shorter than the lower wall 5. The first walls 9*a*, 10*a* of the side flanks 8 are not necessarily of the same height (along the axis Z).

Optionally, the heat sink 4 can comprise at least one strip for assembly to the piece of electronic equipment 100 and/or to the plate 2 (in addition to runners 6). Preferably, the connecting strip is carried by one of the side flanks 8 of the heat sink 4.

In the illustrated and non-limiting example, a first strip 11 extends from the right side flank 8 and a second strip 12 extends from the left side flank 8, the two strips 11, 12 extending in the direction opposite one another.

The heat sink 4 is moreover hollow.

The heat sink 4 is thus provided with at least one opening 13 passing through it so as to open onto its first main face (face surrounded by the side flanks 8, the upper wall 7 and the lower wall 5) and on its second main face (face surrounded by the side flanks 8, the upper wall 7 and the lower wall 5 and which extends, in this case, parallel to the first main face). In this way, when the heat sink 4 is arranged on the plate 2, its opening 13 extends coaxially to the axis Y.

By returning to the heat sinks 4, the heat sinks 4 are arranged such that their different upper walls 7 all extend into one same plane which is, in this case, parallel to the axes X and Y. Preferably, the heat sinks 4 are arranged such that their different lower walls 5 all extend into one same plane, which is, in this case, parallel to the axes X and Y.

Preferably, the first walls 9*a* of the left side flanks 8 of all the heat sinks 4 and the first walls 10*a* of the right side flanks 8 of all the heat sinks 4 all extend parallel to one another and, also in this case, to the plane containing the axes Y and Z.

Preferably, the second walls 9*b* of the left side flanks 8 of all the heat sinks 4 all extend parallel to one another and, also in this case, to one same plane inclined relative to the plane comprising the axes Y and Z.

Preferably, the second walls 10*b* of the right side flanks 8 of all the heat sinks 4 all extend parallel to one another and, also in this case, to a plane inclined relative to the plane comprising the axes Y and Z.

If externally, the heat sinks 4 are aligned, internally the heat sinks 4 are not all identical to one another, such that at least one of the openings 13 of at least one of the heat sinks 4 is offset from at least one of the openings 13 of at least one other of the heat sinks 4.

For example, the two openings 13 (identical or different in shape) are offset against one another in at least one direction belonging to the plane parallel to the main faces of the heat sinks 4 and/or offset against one another in a direction parallel to the axis Z and/or in a direction parallel to the axis X. For example, the openings 13 are offset from one another in a direction parallel to the axis X.

At least one of the openings 13 is shaped to have a rectangular-, square- or trapzium-shaped cross-section (for a cross-section plane parallel to the main faces of the dissipator).

At least one of the openings 13 is shaped to have a cross-section, at least one dimension of which is greater than 4 millimetres and preferably at least one dimension of which is greater than 5 millimetres. For example, the width and/or the length and/or the diameter of the cross-section of the opening 13 is greater than 4 millimetres and preferably greater than 5 millimetres.

Preferably, at least one of the heat sinks 4 comprises a central orifice passing through it, so as to open onto the two main faces of the heat sink 4. In this way, when the heat sink 4 is arranged on the plate 2, its central orifice extends coaxially to the axis Y.

Moreover, the heat sink 4 comprises at least one partition (called internal wall below) 14 arranged in the central orifice. This internal wall 14 making it possible to divide the central orifice into at least two openings 13 such as defined above. The internal wall 14 is thus common to the two orifices 13. For example, the internal wall 14 extends parallel to the first walls 9*a*, 10*a* of the side flanks 8 (that is parallel to the axis Z when the heat sink 4 is in place on the plate). For example, the internal wall 14 extends between the upper wall 7 and the lower wall 5. For example, the internal wall 14 has an identical thickness plus or minus 10%, and preferably plus or minus 5%, to that of the upper wall 7 and/or to that of the lower wall 5 and/or to that of one of the walls of one of the side flanks 8. For example, the internal wall 14 has a thickness of between 1 and 3 millimetres.

It is noted that the heat sink 4 makes it possible to only itself form several fins by way of its internal wall 14, of its side flanks 8, of its upper wall 7 and of its lower wall 5.

It is noted that the heat sink 4 has dimensions larger than a simple fin of the prior art.

Optionally, the heat sink 4 comprises at least two internal walls 14 arranged in the central orifice, internal walls 14 making it possible to divide the central orifice into at least three openings 13 such as defined above. For example, the internal walls 14 extend parallel to one another. For example, the internal walls 14 extend parallel to the first walls 9*a*, 10*a* of the side flanks 8 (that is parallel to the axis Z when the heat sink 4 is in place on the plate 2). For example, the internal walls 14 all extend between the upper wall 7 and the lower wall 5. For example, the internal walls 14 are identical to one another. For example, the internal walls 14 extend between the main faces of the heat sink 4—that is over the entire width of the heat sink 4.

Preferably, all the heat sinks 4 comprise, in this case, a central orifice, in which at least one internal wall 14 is arranged, outlining at least two openings 13 in the heat sink in question. For example, all the internal walls 14 of all the heat sinks 4 all extend parallel to one another.

For example, all the internal walls 14 of all the heat sinks 4 extend parallel to the first walls 9*a*, 10*a* of the side flanks 8 (that is parallel to the axis Z when the heat sink 4 is in place on the plate 2).

For example, all the internal walls 14 of all the heat sinks 4 extend between the main faces of the associated heat sink 4—that is over the entire length of the heat sink 4.

However, between at least two heat sinks 4, the positioning of the internal walls 14 is different and/or the number of internal walls 14 and/or the geometry of the internal walls 14 and/or the inclination of the internal walls 14 is different, such that the openings 13 of said two heat sinks 4 are not aligned with one another.

In this way, when the heat sinks 4 are installed on the plate 2, the heat sinks 4 extend into the alignment of one another along the axis Y and parallel to one another with a spacing along the axis Y between two consecutive heat sinks 4. However, the internal walls 14 of the heat sinks 4 are not all aligned with one another (in a direction parallel to the axis Y, in this case) for at least two heat sinks 4, such that at least one internal wall 14 of one of the heat sinks 4 is aligned (in a direction parallel to the axis Y, in this case) with at least one opening 13 of the other of the heat sinks 4.

The at least two heat sinks 4 in question can be shaped such that an internal wall 14 of the first heat sink 4 is offset from an internal wall 14 of the second heat sink 4 by a distance (in a direction parallel to the axis X) of between 10 and 60% of the distance (in a direction parallel to the axis X) separating the internal wall 14 of the second heat sink 4 from another internal wall 14 (or from a wall of one of the side flanks 8) of the second heat sink 4 defining with the internal wall of the second heat sink 4, an opening 13 of the second heat sink 4. Preferably, the at least two heat sinks 4 in question can be shaped, such that an internal wall 14 of the first heat sink 4 is offset from an internal wall 14 of the second heat sink 4 by a distance (in a direction parallel to the axis X) of between 20 and 50% of the distance (in a direction parallel to the axis X) separating the internal wall 14 of the second heat sink 4 from another internal wall 14 (or from a wall of one of the side flanks 8) of the second heat sink 4 defining with the internal wall 14 of the second heat sink 4, an opening 13 of the second heat sink 4. The internal wall 14 of the first heat sink 4 can thus extend facing the middle of the opening 13 of the second heat sink 4 or to ⅕$^{th}$ of said opening 13 or at an intermediate level between the middle and ⅕$^{th}$ of said opening 13.

For example, the first heat sink 4 represented in figure comprises:

- a first internal wall 14*a* which extends to the junction between the upper wall 7 and the second wall 9*b* of the left side flank 8 to the lower wall 5,
- a second internal wall 14*b* which extends to the junction between the upper wall 7 and a second wall 10*b* of the right side flank 14*c* to the lower wall 5,
- a third internal wall 14*c* which extends between the lower wall 5 and the upper wall 7 equidistant between said walls.

The internal walls 14*a*, 14*b*, 14*c* of the first heat sink 4 are thus distributed at regular intervals along the upper wall 7. The internal walls 14*a*, 14*b*, 14*c* of the first heat sink 4 thus have the same height. The internal walls 14*a*, 14*b*, 14*c* thus define four openings 13 in the central orifice.

For example, the second heat sink comprises:

- a first internal wall which extends between a second wall 9*b* of the left side flank 8 and the lower wall 5,
- a second internal wall which extends between the second wall 10*b* of the right side flank 8 and the lower wall 5,
- a third internal wall which extends between the lower wall 5 and the upper wall 7.

The internal walls 14 of the second heat sink 4 therefore do not all have the same height.

In service, the heat diffused by the piece of electronic equipment 100 is transmitted to the plate 2 (by conduction, by convection, etc.) which itself transmits it to the heat sinks 4 (by conduction, by convection, etc.).

The heat sinks 4 thus make it possible to transfer the calories associated with an airflow (forced or natural) circulating in the device by passing through the openings of the heat sinks 4. For example, if the device 1 is arranged vertically (the axis Y thus extending vertically and the two axes X and Z horizontally), the hot air tending to rise, the airflow will start from one of the side edges of the plate 2 to rise along the plate 2 in a mainly vertical direction to reach the other side edge.

Through the offsetting between the openings 13, these create turbulences in the airflow which cannot flow linearly. This makes it possible to increase the heat exchanges between the device 1 and the airflow.

As can be seen in FIG. 5, the airflow therefore does not follow a linear direction through the presence of obstacles on its path. Indeed, the internal walls 14 (the obstacles) of the heat sinks 4 are aligned with the openings 13 of the other heat sinks 4, the internal walls 14 not being, in this case, all parallel to one another.

Subsequently, the airflow will have to be divided and/or reoriented, then recombined in several airflows to the passage of one, of several, or of all the heat sinks 4. In particular, the openings 14 are not coaxial.

This leads to turbulences in the airflow, which favours heat exchanges between the heat sinks 4 and the airflow and thus favours the discharge of heat generated by the electronic equipment 100. The device 1 thus makes it possible to effectively discharge said heat.

Advantageously, the fact that two successive heat sinks are spaced apart (along the axis Y) makes it possible for additional airflows to penetrate the device via the sides of the device 1 and thus be mixed with the general airflow. The additional airflows thus arrive obliquely or orthogonally to the general flow (subdivided, in this case, into several airflow and through the presence of the internal walls 14).

This makes it possible, not only, to provide fresh air, but also amplify the turbulences.

The discharge of heat generated by the electronic equipment 100 thus has proved to be further increased.

Preferably, each heat sink 4 is different from the immediate upstream heat sink 4 and from the immediately downstream heat sink 4. In the present case, each heat sink 4 comprises at least one opening 13 offset (along the axis Y) from at least one opening 13 of the immediately upstream heat sink 4 and from at least one opening 13 of the immediately downstream heat sink 4. In this way, each heat sink 4 comprises at least one internal wall 14 arranged in the extension from at least one opening 13 of the immediately upstream heat sink 4 and from at least one opening of the immediately downstream heat sink 4.

This makes it possible to further increase the turbulence generated in the airflow.

It is noted that the plate 2 makes it possible to respond to the mechanical stresses (fixing on the electronic equipment 1, heat sink port, fixing or ports of other parts, etc.), as well as to thermal stresses by, in particular, making the thermal connection between the piece of electronic equipment 100 and the heat sinks 4.

It is noted that the heat sinks 4 have the aim of generating turbulences in the airflow. The thermal regulation device 1 according to the first embodiment indeed comprises an offsetting of the internal walls 14 (forming, in this case, fins) of the heat sinks 4 in a direction parallel to the axis X and therefore a corresponding offsetting of the openings 13.

Advantageously, it is also noted that all the heat sinks 4 do not need to all be different from one another to cause turbulences.

Indeed, the device 1 can comprise at least one first group of heat sinks 13 which are identical to one another and at least one second group of heat sinks 13 which are identical to one another, but different from those of the first group to generate a turbulence in the airflow through the device 1 during the positioning of the heat sinks 4 on the plate 2. Preferably, the heat sinks 4 are thus arranged so as to alternate, on at least one zone of the device 1, a heat sink 4 of the first group, successively with a heat sink 4 of the second group (in this case, along the axis Y).

For example, at least one first group of heat sinks 4 which are identical to one another, one second group of heat sinks 4 which are identical to one another, but different from those of the first group and a third group of heat sinks 4 which are identical to one another, but different from those of the first group and different from those of the second group can be had, in order to generate a turbulence in the airflow through the device 1 during the positioning of the heat sinks 4 on the plate 2. Preferably, the heat sinks 4 are thus arranged so as to alternate, on at least one zone of the device 1, successively a heat sink 4 of the first group, a heat sink 4 of the second group, a heat sink 4 of the third group (in this case, along the axis Y). The device 1 can thus comprise between 2 and 6 groups of heat sinks 4 (identical heat sinks 4 within one same group, but different between two groups) and, for example, between 3 and 4 groups of thermal heat sinks.

Such a device 1 can advantageously be manufactured in multiple ways.

For example, the plate 2 can be an extruded or injected plate. Independently from the manufacturing mode of the plate 2, the heat sinks 4 can be extruded or injected. It is also possible to have some extruded heat sinks 4 and some injected heat sinks 4.

The assembly of the heat sinks 4 on the plate 2 can also be done in multiple ways, for example, by welding, by forced assembly, by screwing, by clipping, by flanging, by gluing, through adhesive or glue, by clinching, etc.

Advantageously, the heat sinks 4 and/or the plate 2 can be manufactured from numerous materials and, for example, from one or more metal alloys and, for example, from at least one aluminium alloy and/or from at least one copper alloy, and/or from at least one plastic material. At least one of the heat sinks 4 can be made of the same material as the plate or, on the contrary, be made of a different material.

In addition, such a device 1 can easily be manufactured in large series. Indeed, the heat sinks 4 are of a simple shape. Furthermore, as indicated above, all the heat sinks 4 of one same device do not need to all be different from one another. It is therefore possible to define only a few heat sink 4 models, which are then manufactured on large scales. It is the alternate positioning of the different heat sink 4 models which will make it possible to create offsets in the openings 13.

For example, at least two different geometric profiles can be manufactured, and each of the profiles can be cut, so as to form a first group of heat sinks 4 and a second group of heat sinks 4 which are different from the first ones. Manufacturing the profiles is thus simple and rapid.

A method for manufacturing such a device 1 will now be described. In a first step, the plate 2 is manufactured (by extrusion, by injection, etc.). Preferably, the plate 2 is manufactured, such that it responds to different stresses linked to the associated piece of electronic equipment 100 (mechanical, thermal, radio, hardware stresses, etc.).

In a second step, those which will release more heat and/or those which are the most sensitive to heat are identified from among the components carried by the piece of electronic equipment 100. Thus, the key zones of the plate 2 are identified.

In a third step, the heat sinks 4 are manufactured (by extrusion, by injection, etc.) according to these key zones (positionings and/or numbers and/or extents and/or number of calories to be discharged).

In a fourth step, the heat sinks 4 are assembled on the plate 2, so as to position the heat sinks 4 preferably facing the key zones. It is therefore understood that the features of the key zones (dimensions, number, locations, number of calories to be discharged, etc.) make it possible to characterise the heat sinks 4 (for example, make it possible to size them, and for example, to size their thicknesses-along the axis Y) and to position them. Preferably, in addition to the heat sinks 4 arranged facing the thermal interfaces, one or more other heat sinks 4 can be arranged on the plate 2, in order to further disrupt the airflow along the plate 2.

For example, in the case where the device 1 is arranged vertically (the axis Y thus extending vertically), with a natural airflow, the hot air will tend to rise, such that the air will naturally flow along the axis Y from bottom to top. It is therefore preferable to place the internal walls on this axis to impede its movement. The thickness of the heat sinks 4 (and therefore of the internal walls), defined along the axis Y, thus extends parallel to the airflow. However, the thickness of the internal walls (along the axis X) extends, in this case, orthogonally to the airflow. For example, with a forced airflow, it is preferable to place the internal walls on the circulation axis of the forced airflow. Preferably, the heat sinks 4 are thus arranged, such that the thickness of the heat sinks 4 (and therefore of the internal walls), defined along the axis Y, thus extends parallel to the airflow. However, the thickness of the internal walls (along the axis X) extends, in this case, orthogonally to the airflow. An embodiment has thus been described, making it possible to generate turbulences within an airflow passing through the heat sinks 4 thanks to a different geometry of the heat sinks. Naturally, other embodiments of the invention are possible. Thus, in reference to FIGS. 6 to 10, according to a second embodiment of the invention, the internal walls 14 of the heat sinks are not arranged parallel to one another. At least two internal walls 14 of different heat sinks 4 are arranged inclined against one another. This forces the air to follow a non-linear path and thus to cause turbulence in the airflow. It is indeed understood that the openings 13 of the heat sinks 4 in question are angularly offset against one another.

The second embodiment will now be detailed below.

The thermal regulation device 1 is associated with a piece of electronic equipment 100, in order to thermally regulate said piece of electronic equipment 100. The piece of electronic equipment 100 is, for example, an electronic board, such as a printed circuit board.

The device 1 comprises a plate 2, which is shaped in a small plate. The plate 2 thus has a thinner thickness than its other dimensions. The plate 2 thus has two main faces: a first main face 3*a* and a second main face 3*b*.

The device 1 is arranged such that the first main face 3*b* extends facing one of the faces of the piece of electronic equipment 100. In the present case, the first main face 3*a* extends facing one of the main faces of the electronic equipment 100. Preferably, the device 1 is arranged such that the first main face 3*a* extends parallel to one of the main faces of the electronic equipment 100. The plate 2 is, in this case, fixed to the electronic equipment 100. The plate 2 is thus affixed on the electronic equipment 100 and is located in contact with at least one zone of the electronic equipment 100.

The connection between the plate 2 and the electronic equipment 100 is similar to that of a baseplate of a thermal regulation device of the prior art and will therefore not be detailed in this case.

The device 1 moreover comprises a plurality of heat sinks 4 fitted on the second main face 3*b* of the plate 2. The device 1 comprises, for example, between 2 and 12 thermal heat sinks 4 and, for example, between 2 and 9 thermal heat sinks 4.

The different heat sinks 4 are fitted on the plate 2, so as to extend, in this case, parallel to one another. For example, the heat sinks 4 are arranged so as to extend parallel to the side edges of the plate 2 which themselves extend parallel to an axis X. The second main face 3*b* is thus defined by a plane containing the axis X and an axis Y orthogonal to the axis X.

The heat sinks 4 are moreover fitted on the plate 2, so as to extend following one another along the axis Y. For example, the distance (along the axis Y) between two successive heat sinks 4 is greater than 4 millimetres and for example, greater than 5 millimetres. For example, the distance (along the axis Y) between two successive heat sinks 4 is less than 50 millimetres and for example, less than 40 millimetres. Optionally, the interval between two successive heat sinks 4 is the same over the entire length (along the axis Y) of the second main face 3*b*.

The heat sinks 4 are moreover arranged on the plate 2, such that their width extends, in this case, inclined relative to the axis Y and their length extends parallel to the axis X.

Each heat sink 4 has two main faces extending parallel to one another. In this case, each heat sink 4 is shaped, such that its two main faces extend parallel to a plane containing the axis X and an axis Z which is orthogonal to the axis X and to the axis Y (the thickness of the plate 2 being defined along this axis Z). One of the heat sinks 4 will now be described, the description below also applying to the other heat sinks 4 in the present case. The heat sink 4 is formed of several walls, each wall being shaped in a small plate. The heat sink 4 is however preferably made of one single part. Preferably, the different walls forming the heat sink 4 have a thickness of between 1 and 3 millimetres. At least two walls of one same heat sink 4 can optionally have the same thickness.

The heat sink 4 has a lower wall 5 mounted facing the plate 2 and optionally parallel to the second main face 3*b*. The lower wall 5 thus extends into a plane parallel to the axes X and Y. The lower wall 5 is shaped in a plate.

The lower wall 5 is optionally provided with at least one tab and, for example, at least two tabs by way of which the heat sink 4 rests on the plate 2.

The contacts between the heat sink 4 and the plate 2 are thus of small dimensions.

The heat sink 4 moreover optionally comprises at least one upper wall 7 arranged above the lower wall 5 and extending optionally parallel to the lower wall 5. The upper wall 7 thus extends into a plane parallel to the axes X and Y. The upper wall 7 is shaped in a sheet.

The heat sink 4 moreover comprises side flanks 8 to connect the lower 5 and upper 7 walls to one another.

For example, the left side flank 8 comprises a first wall 9*a* and a second wall 9*b*, the first wall 9*a* extending from the lower wall 5 to the second wall 9*b* and the second wall 9*b* extending from the first wall 9*a* to the upper wall 7. Likewise, the right side flank 8 comprises a first wall 10*a* and a second wall 10*b*, the first wall 10*a* extending from the lower wall 5 to the second wall 10*b* and the second wall 10*a* extending from the first wall 10*a* to the upper wall 7. The first walls 10*a* and the second walls 10*b* are, in this case, shaped in sheets.

In the present case, the first walls 10*a* extend parallel to one another.

In the present case, the second walls 10*b* extend along one same inclination relative to the first associated wall 10*a*, but in opposite directions, such that the second walls 10*b* move closer as the upper wall 7 moves closer. The upper wall 7 is therefore of a length (along the axis X) shorter than the lower wall 5. Optionally, the heat sink 4 can comprise at least one strip for connecting to the piece of electronic equipment 100 and/or to the plate 2 (in addition to runners). Preferably, the connecting strip is carried by one of the side flanks 8 of the heat sink.

The heat sink 4 is moreover hollow.

The heat sink 4 is thus provided with at least one opening 13 passing through it, so as to open onto its first main face (face surrounded by the side flanks 8, the upper wall 7 and the lower wall 5) and onto its second main face (face surrounded by the side flanks 8, the upper wall 7 and the lower wall 5 and which extends, in this case, parallel to the first main face). By returning to all of the heat sinks 4, the heat sinks 4 are arranged, such that their different upper walls 7 all extend into one same plane, which is, in this case, parallel to the axes X and Y.

Preferably, the heat sinks 4 are arranged, such that their different lower walls 5 all extend into one same plane, which is, in this case, parallel to the axes X and Y.

Preferably, the first walls 9*a* of the left side flanks 8 of all the heat sinks 4 and the first walls 10*a* of the right side flanks 8 of all the heat sinks 4 do not all extend parallel to one another.

The first walls 9*a* of the left side flanks 8 of all the heat sinks 4 and the first walls 10*a* of the right side flanks of all the heat sinks 4 moreover extend inclined relative to the plane containing the axes Y and Z.

Preferably, the second walls 9*b* of the left side flanks 8 of all the heat sinks 4 do not all extend parallel to one another. The second walls 9*b* of the left side flanks 8 of all the heat sinks all extend inclined relative to the plane comprising the axes Y and Z.

Preferably, the second walls 10*b* of the right side flanks 8 of all the heat sinks 4 do not all extend parallel to one another. The second walls 10*b* of the right side flanks 8 of all the heat sinks 4 all extend inclined relative to the plane comprising the axes Y and Z.

At least one of the openings 13 of at least one of the heat sinks 4 is moreover angularly offset from at least one of the openings 13 of at least one other of the heat sinks 4.

For example, the two openings 13 (identical or different in shape) are angularly offset against one another: one having a cross-section in a plane containing an axis A parallel to the axis Z and an axis B inclined relative to the axis X and the other having a cross-section extending into a plane containing an axis C parallel to the axis Z and an axis D inclined relative to the axis X. The axes A and C therefore extend parallel to one another. Preferably, the axes B and D extend with one same tilt angle opposite the axis X (as an absolute value), but according to opposite signs. Thus, an internal wall 14 of a first heat sink 4 is inclined opposite the main faces of the first heat sink 4 and an internal wall 14 of the second heat sink 4 is also inclined opposite the main faces of the second heat sink 4 according to the same tilt angle value, but with an opposite tilt angle sign. The internal walls 14 therefore outline a zigzag between the two heat sinks 4.

At least one of the openings 13 is shaped to have a rectangular-, square- or trapezium-shaped cross-section (that is for a cross-section plane parallel to the main faces of the heat sink 4). At least one of the openings 13 is shaped to have a cross-section, at least one dimension of which is greater than 4 millimetres and preferably at least one dimension of which is greater than 5 millimetres. For example, the width and/or the length and/or the diameter of the cross-section of the opening 13 is greater than 4 millimetres and preferably greater than 5 millimetres.

Preferably, at least one of the heat sinks 4 comprises a central orifice passing through it, so as to open onto the two main faces of the heat sink 4.

Moreover, the heat sink 4 comprises at least one partition (called below, internal wall) 14 arranged in the central orifice. The internal wall 14 make it possible to divide the central orifice into at least two openings 13, such as defined above. The internal wall 14 is thus common to the two openings 13.

For example, the internal wall 14 extends parallel and/or orthogonally and/or inclined relative to the first walls 9*a*, 10*a* of the side flanks 8. For example, the internal wall 14 extends between the upper wall 7 and the lower wall 5 or extends between the two side flanks 8. For example, the internal wall 14 has an identical thickness, plus or minus 10%, and preferably plus or minus 5%, to that of the upper wall 7 and/or to that of the lower wall 5 and/or to that of one of the walls of one of the side flanks 8. For example, the internal wall 14 has a thickness of between 1 and 3 millimetres.

It is noted that the heat sink 4 makes it possible to itself form several fins by way of its internal wall 14, of its side flanks 8, of its upper wall 7 and of its lower wall 5.

It is noted that the heat sink 4 is of larger dimensions that a simple fin of the prior art.

Optionally, the heat sink 4 comprises at least two internal walls 14 arranged in the central orifice, internal walls 14 making it possible to divide the central orifice into at least three openings 13, such as defined above. For example, the internal walls 14 extend parallel and/or orthogonally and/or inclined to one another. For example, at least one internal wall 14 extends parallel to the first walls 10, 9*a* of the side flanks 8 and at least one second internal wall 14 extends orthogonally to the first walls 9*a*, 10*a* of the side flanks 8. For example, the internal walls 14 extend between the main faces of the heat sink 4—that is over the entire width of the heat sink 4.

Moreover, between at least two heat sinks 4, the inclination of the internal walls 14 is different, such that the openings 13 of said two heat sinks 4 are not aligned with one another. In this way, when the heat sinks 4 are installed on the plate 2, the heat sinks 4 extend into alignment with one another along the axis Y and parallel to one another with a spacing along the axis Y between two consecutive heat sinks 4. However, the internal walls 14 of the heat sinks 4 are not all aligned with one another (in a direction parallel to the axis Y, in this case) for at least two heat sinks 4, such that at least one internal wall 14 of one of the heat sinks 4 is aligned (in a direction parallel to the axis Y, in this case) with at least one opening 13 of the other of the heat sinks.

The at least two heat sinks 4 in question can be shaped, such that an internal wall 14 of the first heat sink 4 is angularly offset from an internal wall 14 of the second dissipator. For example, at least one of the internal walls 14 of the first heat sink 4 and/or at least one of the internal walls 14 of the second heat sink 4 is inclined by an angle β of a plane comprising the axes Y and Z, the angle β of between 5 and 35 degrees, and for example, of between 10 and 30 degrees.

For example, the first heat sink 4 comprises:

- a first internal wall 14*a* which extends between the second wall 9*b* of the left side flank 8 to the lower wall 5,
- a second internal wall 14*b* which extends between the second wall 10*b* of the right side flank 8 to the lower wall 5,
- a third internal wall 14*c* which extends between the lower wall 5 and the upper wall 7 equidistant between said walls,
- a fourth internal wall 15 which extends between the side flanks 8.

In this way, the first heat sink 4 comprises eight openings 13 distributed over two stages (the fourth internal wall 15 delimiting said two stages).

The fourth internal wall 15 is, for example, parallel to the lower 5 and upper 7 walls (and therefore inclined, in this case, relative to the side flanks 8). The first three internal walls 14*a*, 14*b*, 14*c* are moreover parallel to the first walls 9*a*, 10*a* of the side flanks 8 (and therefore inclined relative to the upper 7 and lower 5 walls).

For example, the second heat sink 4 is identical to the first heat sink 4 apart from the fact that its first three walls 14 are inclined relative to the lower 5 and upper 7 walls with one same angle as an absolute value relative to the lower 5 and upper 7 walls, but with a different sign.

In service, the heat diffused by the piece of electronic equipment 100 is transmitted to the plate 2 (by conduction, by convection, etc.) which itself transmits it to the heat sinks 4 (by conduction, by convection, etc.).

The heat sinks 4 thus make it possible to transfer the calories associated with an airflow (forced or natural) circulating in the device 1 by passing through the openings 13 of the heat sinks 4. For example, if the device 1 is arranged vertically (the axis Y thus extending vertically and the two axes X and Z horizontally), the hot air tending to rise, the airflow will start from one of the side edges of the plate 2 to rise along the plate 2 in a mainly vertical direction to reach the other side edge.

Through the angular offsetting between the openings 13, these create turbulences in the airflow which cannot flow linearly, the openings 13 obligating it to modify its flow direction from one heat sink 4 to another. This makes it possible to increase the heat exchanges between the device 1 and the airflow.

It is therefore understood that the openings 13 of at least two heat sinks 4 are not coaxial and force an airflow passing through one of the openings 13 to deviate from a purely linear path.

As can be seen in FIG. 10, the airflow does not therefore follow a linear direction due to the presence of obstacles on its path. Indeed, the internal walls 14 (the obstacles) of the heat sinks 4 are aligned with the openings 13 of the other heat sinks 4, the internal walls 14 not all being parallel to one another. Subsequently, the airflow will have to be divided and/or be reoriented then be recombined in several airflows to the passage of one, of several or of all the heat sinks 4. In particular, the openings 13 are not coaxial.

This leads to turbulences in the airflow, which favours heat exchanges between the heat sinks 4 and the airflow and thus favours the discharge of the heat generated by the electronic equipment 100.

In particular, the internal walls 14 are offset by a certain angle with respect to the airflow which redirects it. By inverting the tilt angle of the internal walls 14 from one heat sink 4 to another (preferably between each successive pair of heat sinks 4 of the device 1), the airflow zigzags along the device 1.

The device 1 thus makes it possible to effectively discharge said heat.

Advantageously, the fact that two successive heat sinks 4 are spaced apart (along the axis Y) makes it possible for additional airflows to penetrate the device 1 via the sides of the device 1, and thus be mixed with the general airflow. The additional airflows thus arrive obliquely or orthogonally to the general flow (subdivided, in this case, into several airflows due to the presence of the internal walls 14).

This makes it possible, not only to provide fresh air, but also to amplify the turbulences.

The discharge of the heat generated by the electronic equipment 100 has thus proved to be further increased.

Preferably, the internal walls 14 of a heat sink 1 are inclined differently from the internal walls 14 of the immediately upstream heat sink 1 and of the immediately downstream heat sink 1. In the present case, each heat sink 1 comprises at least one offset opening 13 (angularly from at least one opening 13 of the immediately upstream heat sink 4 and from at least one opening 13 of the immediately downstream heat sink 4). In this way, each heat sink 4 comprises at least one internal wall 14 arranged in the extension from at least one opening 13 of the immediately upstream heat sink and from at least one opening 13 of the immediately downstream dissipator.

This makes it possible to further increase the turbulence generated in the airflow.

It is noted that the plate 2 makes it possible to respond to mechanical stresses (fixing on the piece of electronic equipment 100, heat sink 4 port, fixing or ports of other parts, etc.), as well as to thermal stresses, in particular by making the thermal connection between the piece of electronic equipment 100 and the heat sinks 4.

It is noted that the heat sinks 4 aim to generate turbulences in the airflow. The thermal regulation device 1 according to the second embodiment indeed comprises an angular offsetting of the internal walls 14 (forming, in this case, fins) of the heat sinks 4 and therefore a corresponding offsetting of the openings 13. Advantageously, it is also noted that all the heat sinks 4 do not need to all be different from one another to cause turbulences. Indeed, the device 1 can comprise at least one first groups of heat sinks 4 which are identical to one another and at least one second group of heat sinks 4 which are identical to one another, but different from the heat sinks 4 of the first group to generate a turbulence in the airflow through the device 1 during the positioning of the heat sinks 4 on the plate 2. Preferably, the heat sinks 4 are thus arranged so as to alternate, on at least one zone of the device 1, a heat sink 4 of the first group, with successively a heat sink 4 of the second group (in this case, along the axis Y). The device 1 can thus comprise between 2 and 6 groups of heat sinks 4 (identical heat sinks 4 within one same group, but different between two groups), and for example, between 3 and 4 groups of thermal heat sinks.

Advantageously, all the heat sinks 4 can be identical to one another before being assembled on the plate 2. Indeed, it is thus sufficient to modify the relative orientation of the heat sinks 4 on the plate 2 to orient the internal walls 14 between two heat sinks 4 differently. For example, it is sufficient to arrange a first heat sink 4 and to arrange a second heat sink 4 by returning it relative to the first heat sink 4 to obtain an angular offsetting between the internal walls 14 of said two heat sinks 4. Such a device 1 can advantageously be manufactured in multiple ways.

For example, the plate 2 can be an extruded or injected plate. Independently from the manufacturing mode of the plate 2, the heat sinks 4 can be extruded or injected. It is also possible to have some extruded heat sinks 4 and some injected heat sinks 4.

The assembly of the heat sinks 4 on the plate 2 can also be done in multiple ways, for example, by welding, by forced assembly, by screwing, by clipping, by flanging, by gluing, through adhesive or glue, by clinching, etc.

Advantageously, the heat sinks 4 and/or the plate 2 can be manufactured from numerous materials and, for example, from one or more metal alloys and, for example, from at least one aluminium alloy and/or from at least one copper alloy, and/or from at least one plastic material. At least one of the heat sinks 4 can be made of the same material as the plate 2 or, on the contrary, made of a different material.

In addition, such a device 1 can easily be manufactured in large series. Indeed, the heat sinks 4 are of a simple shape. Furthermore, as indicated above, all the heat sinks 4 of one same device do not need to all be different from one another. It is therefore possible to manufacture only a few heat sink 4 models, which are then manufactured on large scales. It is the alternate positioning of the different heat sink 4 models which will make it possible to create offsets in the openings 13.

For example, at least two different geometric profiles can be manufactured, and each of the profiles can be cut so as to form a first group of heat sinks 4 and a second group of heat sinks 4. Manufacturing the profiles is thus simple and rapid. As already indicated, one single profile can even be manufactured and cut into sections with an inclination opposite the axial direction of the profile to form the different heat sinks 4. Then, the heat sinks 4 must be arranged with a different orientation opposite the plate 2.

A method for manufacturing such a device 1 will be described.

In a first step, the plate 2 is manufactured (by extrusion, by injection, etc.). Preferably, the plate 2 is manufactured, such that it responds to different stresses linked to the associated piece of electronic equipment 100 (mechanical, thermal, radio, hardware stresses, etc.).

In a second step, those which will release more heat and/or those which are the most sensitive to heat are identified from among the components carried by the piece of electronic equipment 100. Thus, the key zones of the plate 2 are identified.

In a third step, the heat sinks 4 are manufactured (by extrusion, by injection, etc.) according to these key zones (positionings and/or numbers and/or extents and/or number of calories to be discharged).

In a fourth step, the heat sinks 4 are assembled on the plate 2 so as to position the heat sinks 4, preferably facing the key zones. It is therefore understood that the features of the key zones (dimensions, number, locations, number of calories to be discharged, etc.) make it possible to characterise the heat sinks 4 (for example, make it possible to size them and, for example, to size their thicknesses—along the axis Y) and to position them. Preferably, in addition to the heat sinks 4 arranged facing the thermal interfaces, one or more other heat sinks 4 can be arranged on the plate 2, in order to further disrupt the airflow long the plate 2.

For example, in the case where the device 1 is arranged vertically (the axis Y thus extending vertically), with a natural airflow, the hot air will tend to rise, such that the air will naturally flow long the axis Y from bottom to top. It is therefore preferable to place the internal walls 14 on this axis to impede its movement. For example, with a forced airflow, it is preferable to place the internal walls 14 on the circulation axis of the forced airflow. Embodiments making it possible to generate turbulences within an airflow passing through the heat sinks 4 have thus been described.

It is therefore understood that different solutions thus entering into the scope of the invention are possible. Indeed, the offsetting between the openings 13 can be done in several ways. According to a first option, at least two heat sinks 4 (identical or not) can be offset from one another along at least one axis X, Y, Z.

According to a second option (combinable with the first option), at least two heat sinks 4 can have a different geometry. The aim is thus to place an internal wall 14 of one of the heat sinks 4 facing the opening 13 of the other of the heat sinks 4.

According to a third option (combinable with the first option and/or the second option), at least two heat sinks 4 can be angularly offset from one another, the two heat sinks 4 do not therefore extend parallel to one another. The aim is thus to direct the air from one heat sink 4 to another, by making it follow a non-linear path.

Naturally, the invention is not limited to the embodiments described, but comprises any variant entering into the field of the invention, such as defined by the claims.

In particular, it is possible to combine the two embodiments and variants described above.

Thus, the heat sinks of the first embodiment can comprise several stages, like in the second embodiment. Heat sinks which are parallel to one another can also be had, like in the first embodiment, but with at least one internal wall of a heat sink inclined relative to at least one internal wall 4 another dissipator, so as to force the flow to be reoriented differently between the two heat sinks in question, like in the second embodiment. The first walls of the side flanks of the second embodiment can be orthogonal to the lower and upper walls, like in the first embodiment (only the internal walls will thus have a tilt angle with said lower and/or upper walls).

The heat sinks can have a shape, other than that described and thus comprise a different number of openings and/or a different number of internal walls and/or a different number of stages to what has been indicated.

The arrangement of the heat sinks (for example, the spacing between two successive heat sinks) and/or their number and/or their shape (for example, their width) can be different from what has been indicated. For example, this will depend on the overall geometry of the device and/or of the associated piece of electronic equipment, and in particular of the dimensions of the arrangement of its components and thermal interfaces and/or of the dimensions of the plate and/or of the thermal power to be dissipated. The separation between two successive heat sinks cannot be regular over a series of heat sinks belonging to the same device. At least one of the heat sinks can be a profile or a profile section. Although, in this case, each orifice is shaped so as to have an identical cross-section over the entire width of the dissipator, at least one orifice can have a section which is modified over the width of the dissipator. For example, at least one orifice can be narrowed between the two main faces of the dissipator.

Although, in this case, at least one heat sink is provided with at least one tab, at least one heat sink may not have a tab.

Although, in this case, at least one heat sink comprises at least one upper wall, at least one heat sink may not have a lower wall.

The invention claimed is:

1. A thermal regulation device comprising:
- one plate;
- at least two heat sinks fitted on the plate, each heat sink comprising at least one opening, through which an airflow is intended to circulate, the two heat sinks being fitted on the plate, such that their openings are offset against one another and/or such that at least one wall outlining at least one of the openings is located in the alignment of the other opening, wherein the heat sinks are fitted on the plate, so as to extend following one another along an axis; and
- between two and six groups of thermal heat sinks, the heat sinks being identical within one same group, but different between two groups, such that the heat sinks between two groups have different geometric profiles,
- wherein the heat sinks are arranged so as to alternate on at least one zone of the device successively, along the axis, a heat sink of each of the groups.

2. The device according to claim 1, wherein at least one of the heat sinks has an orifice and at least one partition passing through said orifice, so as to divide it into two openings.

3. The device according to claim 2, wherein the wall located in the alignment of the other opening is the partition.

4. The device according to claim 2, wherein the partition has a thickness of between 1 and 3 millimeters.

5. A thermal regulation device comprising:
- one plate;
- at least two heat sinks fitted on the plate, each heat sink comprising at least one opening, through which an airflow is intended to circulate, the two heat sinks being fitted on the plate, such that their openings are offset against one another and/or such that at least one wall outlining at least one of the openings is located in the alignment of the other opening, wherein the heat sinks are fitted on the plate, so as to extend following one another along an axis; and
- between two and six groups of thermal heat sinks, the heat sinks being identical within one same group, but different between two groups,
- wherein the heat sinks are arranged so as to alternate on at least one zone of the device successively, along the axis, a heat sink of each of the groups,
- wherein at least one of the heat sinks has an orifice and at least one partition passing through said orifice, so as to divide it into two openings, and
- wherein the partition extends inclined relative to at least one upper wall, a lower wall or a side flank of an associated heat sink.

6. The device according to claim 1, wherein each of the heat sinks comprises a partition extending inclined relative to at least one upper wall, a lower wall or a side flank of an associated heat sink.

7. The device according to claim 1, wherein the openings are angularly offset against one another and/or are transversally offset against one another.

8. The device according to claim 1, wherein the heat sinks are arranged parallel to one another.

9. The device according to claim 1, wherein the heat sinks are offset from one another in a longitudinal direction of the plate.

10. The device according to claim 1, wherein the at least two heat sinks have a different geometry.

11. The device according to claim 1, wherein the plate and/or at least one of the heat sinks is made of or based on aluminum alloy.

12. The device according to claim 1, wherein the plate and/or at least one of the heat sinks is an injected or extruded part.

13. The device according to claim 1, wherein the plate and at least one of the heat sinks are made of the same material.

14. The device according to claim 1, wherein at least one of the heat sinks is provided with at least one tab by way of which it rests against the plate.

15. A piece of electronic equipment equipped with a thermal regulation device according to claim 1.

16. The piece of equipment according to claim 15, wherein the piece of electronic equipment is an electronic board.

17. The device according to claim 1, wherein the heat sinks between two groups have openings with different shapes.

18. The device according to claim 1, wherein the heat sinks between two groups have a different positioning of internal walls and/or a different number of internal walls and/or a different geometry of internal walls 14 and/or a different inclination of internal walls.

* * * * *